United States Patent
Hasegawa et al.

(10) Patent No.: US 7,816,696 B2
(45) Date of Patent: Oct. 19, 2010

(54) NITRIDE SEMICONDUCTOR DEVICE AND METHOD FOR MANUFACTURING SAME

(75) Inventors: Yoshiaki Hasegawa, Shiga (JP); Gaku Sugahara, Nara (JP); Naomi Anzue, Osaka (JP); Akihiko Ishibashi, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 335 days.

(21) Appl. No.: 11/908,430

(22) PCT Filed: Mar. 9, 2006

(86) PCT No.: PCT/JP2006/304596

§ 371 (c)(1),
(2), (4) Date: Sep. 12, 2007

(87) PCT Pub. No.: WO2006/098215

PCT Pub. Date: Sep. 21, 2006

(65) Prior Publication Data

US 2009/0022193 A1 Jan. 22, 2009

(30) Foreign Application Priority Data

Mar. 16, 2005 (JP) .............................. 2005-074546

(51) Int. Cl.
*H01L 29/267* (2006.01)
*H01L 21/332* (2006.01)

(52) U.S. Cl. .................... 257/95; 438/29; 438/476; 257/E33.005; 257/E33.043; 257/E33.074

(58) Field of Classification Search ........... 257/79–104, 257/E33.003, E33.005, E33.006, E33.043, 257/E33.065, E33.067, E33.068, E33.074; 117/2; 438/471, 476, 29
See application file for complete search history.

(56) References Cited

U.S. PATENT DOCUMENTS

| 6,455,877 | B1 | 9/2002 | Ogawa et al. |
| 6,784,460 | B2 * | 8/2004 | Ng et al. ........................ 257/95 |
| 6,791,120 | B2 | 9/2004 | Toda et al. |
| 7,105,859 | B2 * | 9/2006 | Yamamoto et al. ............ 257/95 |
| 2005/0040410 | A1 * | 2/2005 | Ledentsov et al. ............ 257/79 |

FOREIGN PATENT DOCUMENTS

| JP | 2002-016312 | | 1/2002 |
| JP | 03/035945 | | 5/2003 |
| JP | 2004-006718 | | 1/2004 |
| JP | 2004-071657 | | 3/2004 |
| JP | 2004-260152 | * | 9/2004 |

OTHER PUBLICATIONS

International Search Report for corresponding Application No. PCT/JP2006/304596 mailed Apr. 4, 2006.
Form PCT/ISA/237 and partial English translation.

\* cited by examiner

*Primary Examiner*—Matthew W Such
*Assistant Examiner*—Ali Naraghi
(74) *Attorney, Agent, or Firm*—Renner, Otto, Boisselle & Sklar, LLP

(57) ABSTRACT

An nitride semiconductor device according to the present invention is a nitride semiconductor device including: an n-GaN substrate 10; a semiconductor multilayer structure 100 formed on a principal face of the n-GaN substrate 10, the semiconductor multilayer structure 100 including a p-type region and an n-type region; a p-side electrode 32 which is in contact with a portion of the p-type region included in the semiconductor multilayer structure 100; and an n-side electrode 34 provided on the rear face of the n-GaN substrate 10. The rear face of the n-GaN substrate includes a nitrogen surface, such that a carbon concentration at an interface between the rear face and the n-side electrode 34 is adjusted to 5 atom % or less.

13 Claims, 10 Drawing Sheets

Comparative Example (a)

Example (b)

Comparative Example (a)

Example (b)

NITRIDE SEMICONDUCTOR DEVICE AND METHOD FOR MANUFACTURING SAME

TECHNICAL FIELD

The present invention relates to a nitride semiconductor device and a production method thereof.

BACKGROUND ART

Blue-violet semiconductor lasers which are produced by using III-V group nitride semiconductor materials ($Al_x$-$Ga_y In_{1-x-y} N$ ($0 \leq x \leq 1$, $0 \leq y \leq 1$)), such as gallium nitride (GaN), are key devices for realizing ultrahigh density recording in optical disk apparatuses, and now are reaching a practical level. Increasing the output of a blue-violet semiconductor laser would not only enable rapid writing to an optical disk, but would also be an indispensable technology for exploring new technological fields, such as applications to laser displays.

In recent years, GaN substrates are regarded promising as substrates which are necessary for producing nitride semiconductor devices. GaN substrates are superior to the conventionally-used sapphire substrates in terms of crystal lattice matching and heat-releasing ability. Another advantage is that GaN substrates are electrically conductive, whereas sapphire substrates are insulators. In other words, an electrode may also be formed on the rear face of a GaN substrate, thus adopting a structure in which a current will flow in a direction across the GaN substrate. Forming an electrode on the rear face of an electrically-conductive GaN substrate makes it possible to reduce the size (chip area) of each individual semiconductor device. A reduced chip area means an increased total number of chips that can be produced from a single wafer, whereby the production costs can be reduced.

A semiconductor laser having an n-side electrode which is formed on the rear face of a GaN substrate is disclosed in Patent Document 1, for example.

[Patent Document 1] Japanese Laid-Open Patent Publication No. 2002-16312

[Patent Document 2] Japanese Laid-Open Patent Publication No. 2004-71657

[Patent Document 3] Japanese Laid-Open Patent Publication No. 2004-6718

DISCLOSURE OF INVENTION

Problems to be Solved by the Invention

When an n-side electrode is formed on the rear face of a GaN substrate, there exists a problem of poor contact characteristics. In the conventional techniques which are described in the aforementioned Patent Documents, too, attempts are made to improve the contact characteristics by, for example, forming bumps and dents on the substrate rear face.

However, the method of forming bumps and dents on the substrate rear face, as is done in the conventional methods, makes it necessary to additionally employ a step of performing micromachining for the substrate rear face after the substrate has been thinly polished, and it is difficult to form appropriate bumps and dents with a good reproducibility and a high production yield. Therefore, in order to enable mass production of nitride semiconductor devices, it is desired to ascertain the causes for the increased contact resistance and find a simple method for removing such causes.

The present invention has been made in view of the above circumstances, and an objective thereof is to provide a nitride semiconductor device having improved contact characteristics on the substrate rear face side and a production method thereof.

Means for Solving the Problems

A nitride semiconductor device according to the present invention is a nitride semiconductor device comprising: a nitride-type semiconductor substrate containing an n-type impurity; a semiconductor multilayer structure formed on a front face (principal face) of the semiconductor substrate, the semiconductor multilayer structure including a p-type region and an n-type region; a p-side electrode which is in contact with a portion of the p-type region included in the semiconductor multilayer structure; and an n-side electrode provided on a rear face (opposing the principal face) of the semiconductor substrate, wherein the rear face of the semiconductor substrate includes a nitrogen surface, with a carbon concentration or 5 atom % or less at an interface between the rear face of the semiconductor substrate and the n-side electrode.

In a preferred embodiment, the n-side electrode includes a layer composed of at least one kind of metal or alloy selected from the group consisting of Ti, Al, Pt, Au, Mo, Sn, In, Ni, Cr, Nb, Ba, Ag, Rh, Ir, Ru, and Hf.

In a preferred embodiment, the n-side electrode has a contact resistivity of $5 \times 10^{-4} \Omega \cdot cm^2$ or less.

In a preferred embodiment, the nitrogen surface accounts for an area ratio of 10% or more in the rear face of the semiconductor substrate.

In a preferred embodiment, the carbon concentration at the interface is 2 atom % or less.

In a preferred embodiment, the rear face of the semiconductor substrate is composed of a polished surface.

In a preferred embodiment, an insulating layer containing oxygen is provided on a portion of the rear face of the semiconductor substrate.

A production method for a nitride semiconductor device according to the present invention is a production method for a nitride semiconductor device, comprising: a step of providing a nitride-type semiconductor substrate containing an n-type impurity; a step of forming a semiconductor multilayer structure on a front face (principal face) of the semiconductor substrate, the semiconductor multilayer structure including a p-type region and an n-type region; a step of forming a p-side electrode on the p-type region included in the semiconductor multilayer structure; and a step of forming an n-side electrode on a rear face (i.e., the surface opposing the principal face) of the semiconductor substrate, the rear face including a nitrogen surface, wherein, before forming the n-side electrode on the rear face of the semiconductor substrate, a step of reducing a carbon concentration in the rear face is performed.

In a preferred embodiment, the step of reducing the carbon concentration comprises: a step of forming an insulative film on the rear face of the semiconductor substrate; and a step of removing the insulative film.

In a preferred embodiment, the step of reducing the carbon concentration comprises: a step of depositing a silicon oxide film on the rear face of the semiconductor substrate; and a step of removing the silicon oxide film.

In a preferred embodiment, the step of reducing the carbon concentration comprises a step of exposing the rear face of the semiconductor substrate to a plasma.

A production method for a nitride semiconductor device comprises: a step of depositing an insulative film on a rear face of a nitride-type semiconductor substrate; a step of removing the insulative film; and a step of forming an electrode on the rear face of the semiconductor substrate.

In a preferred embodiment, the insulative film is composed of silicon oxide.

Effects of the Invention

According to the present invention, prior to forming an n-side electrode on the rear face of a nitride-type semiconductor substrate, a step of reducing the carbon concentration in the rear face is performed, whereby the carbon concentration at the interface between the substrate rear face and the n-side electrode is reduced, thus resulting in improved contact characteristics.

Figure 1:
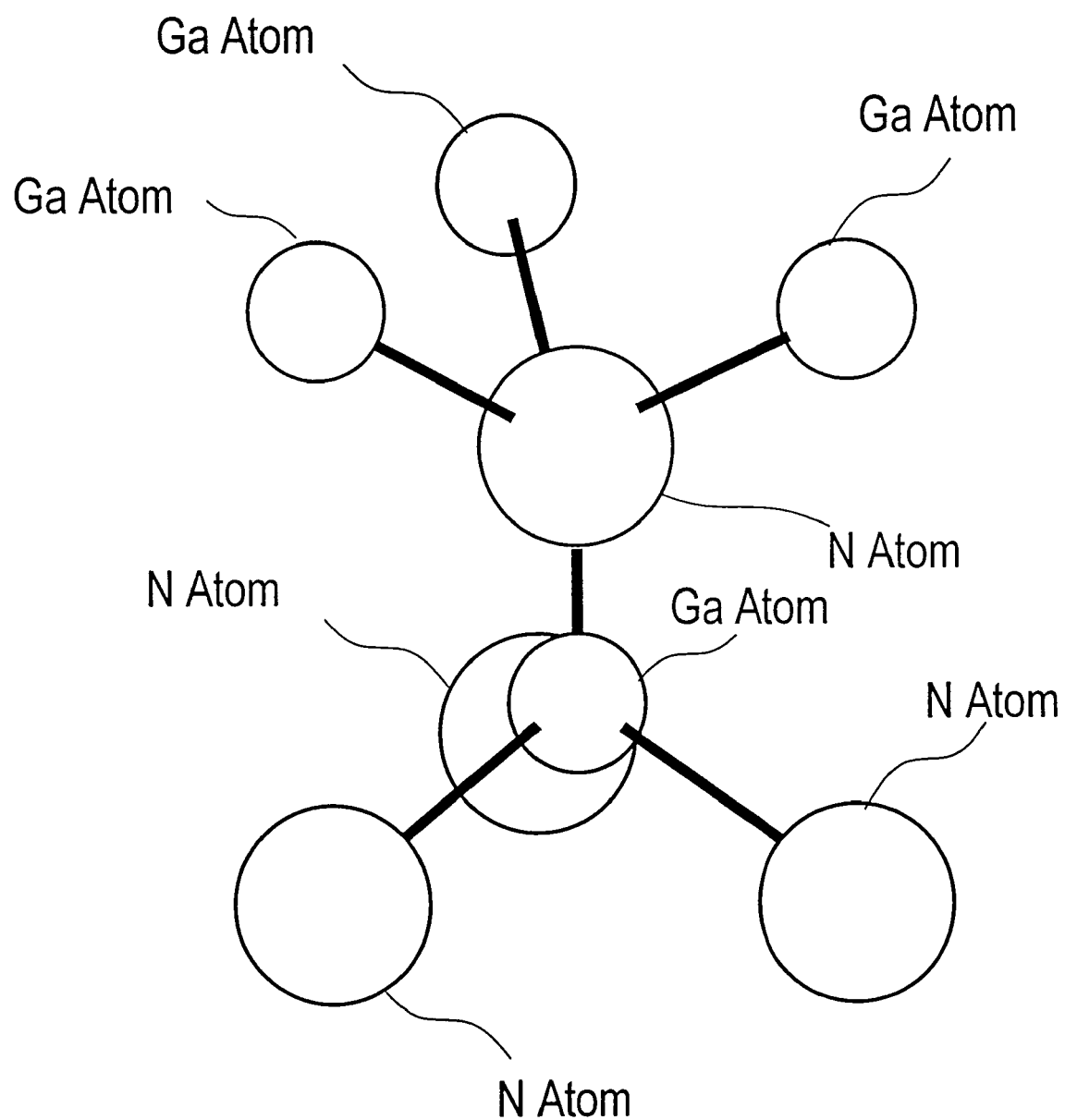
FIG. 1 A perspective view schematically showing a GaN crystal structure of a GaN substrate.

DESCRIPTION OF THE REFERENCE NUMERALS 10 n-GaN substrate
12 n-GaN layer
14 n-AlGaN cladding layer
16 GaN optical guide layer
18 InGaN multi-quantum well layer
20 InGaN intermediate layer
22 p-AlGaN capping layer
24 p-GaN optical guide layer
26 p-AlGaN cladding layer
28 p-GaN contact layer
30 $SiO_2$ layer
32 p-side electrode (Pd/Au)
34 n-side electrode (Ti/Al/Ti/Pt/Au)
36 $SiO_2$ layer
100 semiconductor multilayer structure

BEST MODE FOR CARRYING OUT THE INVENTION

The inventors have experimentally confirmed that the cause for the high contact resistance of an n-side electrode which is formed on the rear face (bottom surface) of a nitride semiconductor substrate is the carbon (C) that is present in the rear face of the nitride semiconductor substrate, and also found that reducing the carbon concentration at the interface between the rear face and the n-side electrode of the nitride semiconductor substrate is effective for reducing the contact resistance, thus arriving at the present invention.

A GaN crystal has a crystal structure as shown in FIG. 1. The front face (top surface) on the side of a GaN substrate where various semiconductor layers are to be epitaxially grown is a surface in which a layer of Ga atoms are arrayed (a Ga surface or +C polarity surface). On the other hand, the rear face of a GaN substrate is a surface in which a layer of nitrogen atoms (N atoms) are arrayed (a nitrogen surface or –C polarity surface). The nitrogen surface (hereinafter referred to as the "N surface") is of such a nature that it always appears on the rear face of a GaN substrate, even if the GaN substrate is polished from the rear face side to reduce the substrate thickness to an arbitrary thickness. Note that, also in a traditional nitride semiconductor substrate, where Ga atoms of a GaN substrate are substituted by Al atoms or In atoms at some sites, the substrate rear face is similarly an N surface.

In the present specification, an N surface (nitrogen surface) is meant to be a plane which is parallel to the –C polarity surface. Herein, "parallel" does not require that the angle which is formed between the N surface and the –C polarity surface is exactly 0°, but means that this angle is 3° or less.

According to a study by the inventors, the N surface of a nitride semiconductor substrate (such as a GaN substrate) is likely to adsorb carbon, and after an electrode is formed on the N surface, carbon will stably remain at the interface between the N surface and the electrode. Such carbon will not diffuse into the surroundings even after a heat treatment which follows the electrode formation, but will stably exist in the interface to function as an electrical barrier in the contact interface. If the carbon existing in the substrate rear face can be appropriately eliminated before forming the n-side electrode, the electrical barrier existing in the contact interface can be reduced, whereby the contact characteristics of the n-side electrode can be significantly improved.

The rear face (i.e., the surface which constitutes an N surface) of a GaN substrate is in a smooth state after a polishing process, such that substantially the entirety thereof is an N surface. This state is not affected even if a wet process for cleaning is performed. Therefore, the "polished surface" in the present specification encompasses not only a surface which has been exposed through a polishing process, but also a surface whose surface has been etched substantially uniformly for cleaning. The reason is that, after performing such an etching directed to cleaning, too, an N surface is exposed similar to an N surface which is formed through a polishing process.

According to the present invention, by a known semiconductor-growing method using epitaxial growth technique, a semiconductor multilayer structure is formed on the front face (Ga surface) of a nitride semiconductor substrate. The semiconductor multilayer structure includes a p-type region and an n-type region. When producing a light-emitting device such as a semiconductor laser, the semiconductor multilayer structure will include a double hetero structure and a structure for confining light and a current within a certain space.

After a p-side electrode which is in electrical contact with the p-type region within the semiconductor multilayer structure is formed on the front face side of the nitride substrate, and before forming an n-side electrode on the rear face of the nitride semiconductor substrate, the present invention performs a special treatment, i.e., a step of reducing the carbon concentration in the rear face of the nitride semiconductor substrate.

In a preferred embodiment, the treatment for reducing the carbon concentration includes a step of covering the rear face of the nitride semiconductor substrate with a layer of deposit, and a step of removing this layer by etching. More preferably, after a silicon dioxide ($SiO_2$) film is deposited on the rear face of the nitride semiconductor substrate, this $SiO_2$ film is removed from the rear face.

If an n-side electrode is formed on the rear face of the nitride semiconductor substrate after performing such a treatment (rear face treatment), no carbon will be observed at the interface between the substrate rear face and the n-side electrode, and thus the carbon concentration at the interface can be reduced to the detectable limit of the measuring apparatus or even less.

EXPERIMENTAL EXAMPLES

First, a plurality of GaN substrates (thickness: about 100 μm) each having a polished rear face (N surface) were prepared, and, by ECR sputtering technique, an $SiO_2$ film was deposited to 0.5 to 1.5 μm on the rear face of each GaN substrate belonging to a first group (Example). Thereafter, the $SiO_2$ film was etched with a hydrofluoric acid (room temperature), and after allowing the rear face of the GaN substrate to be exposed again, an electrode pattern was formed on the rear face of the GaN substrate. On the other hand, on the rear face of each GaN substrate belonging to the second group, an electrode pattern was formed without performing any special rear face treatment. In either case, the electrode pattern formation was performed by, after stacking metal layers in the order of Ti/Al/Ti/Pt/Au from the substrate, removing unwanted portions by lift-off technique. The thicknesses of the layers Ti/Al/Ti/Pt/Au were, respectively, Ti:5 nm/Al:40 nm/Ti:40 nm/Pt:40 nm/Au:50 nm. These metal layers are to be deposited by electron-beam evaporation (EB) technique or the like.

Figure 2:
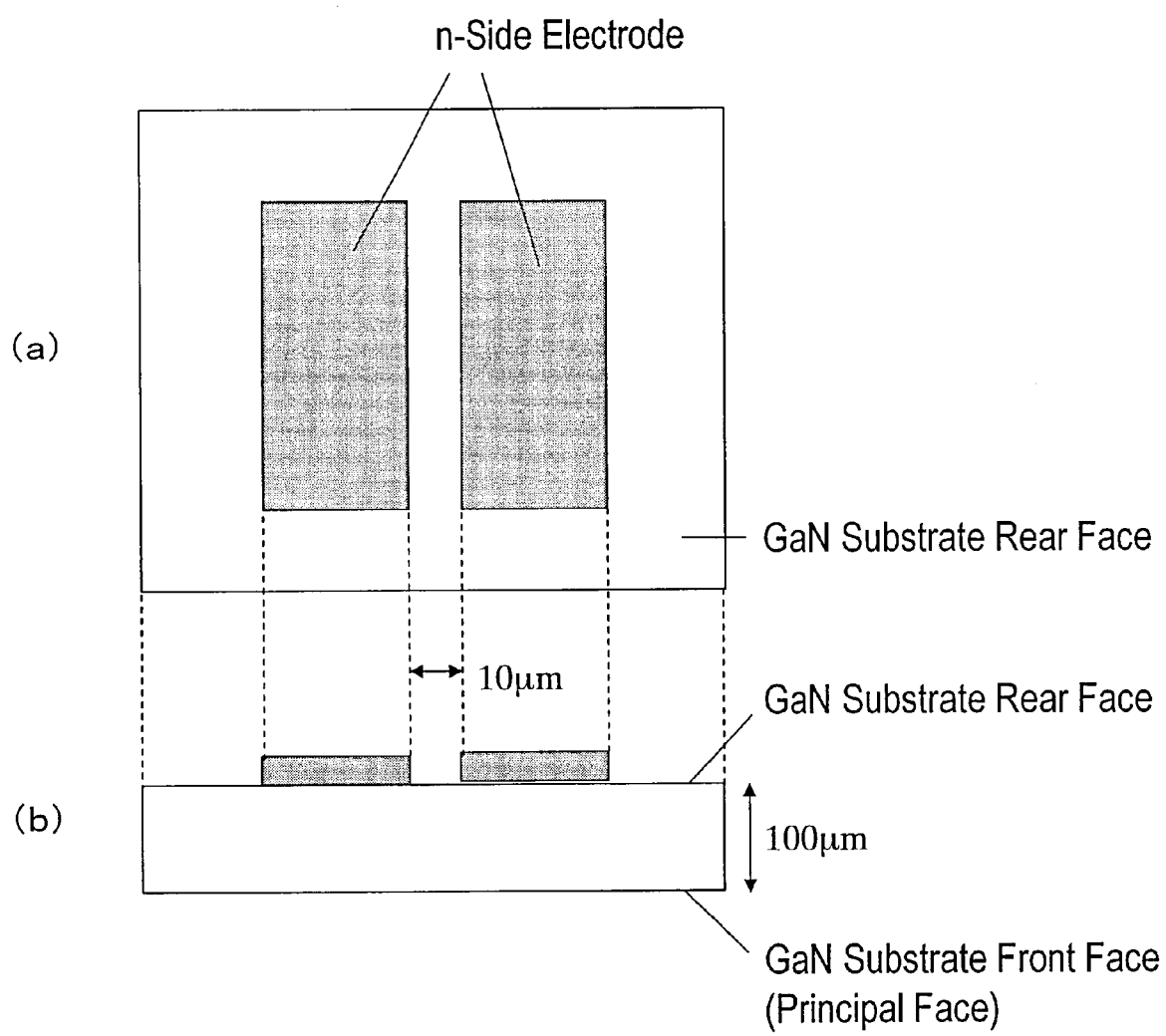
FIG. 2(a) is an upper plan view schematically showing an electrode pattern which is formed on the rear face of one GaN substrate according to experimental examples of the present invention; and (b) is a cross-sectional view thereof.

FIGS. 2(a) and (b) show a pair of n-side electrodes which are formed on the rear face of a GaN substrate. Each of the pair of n-side electrodes has a rectangular shape of 100 μm×200 μm. Note that the interval between electrodes is 10 μm. With respect to the Example and the Comparative Example, while varying the voltage applied between the pair of n-side electrodes, the current flowing the electrodes was measured and the current-voltage characteristics were evaluated.

Figure 3:
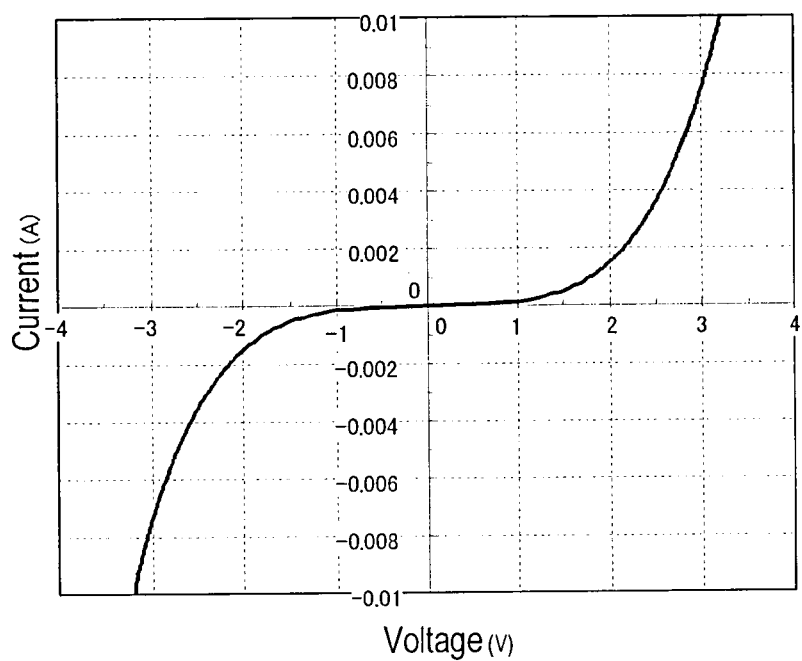
FIG. 3(a) is a graph showing current-voltage characteristics obtained from a Comparative Example against the present invention; and (b) is a graph showing current-voltage characteristics obtained from an Example.
Figure 3:
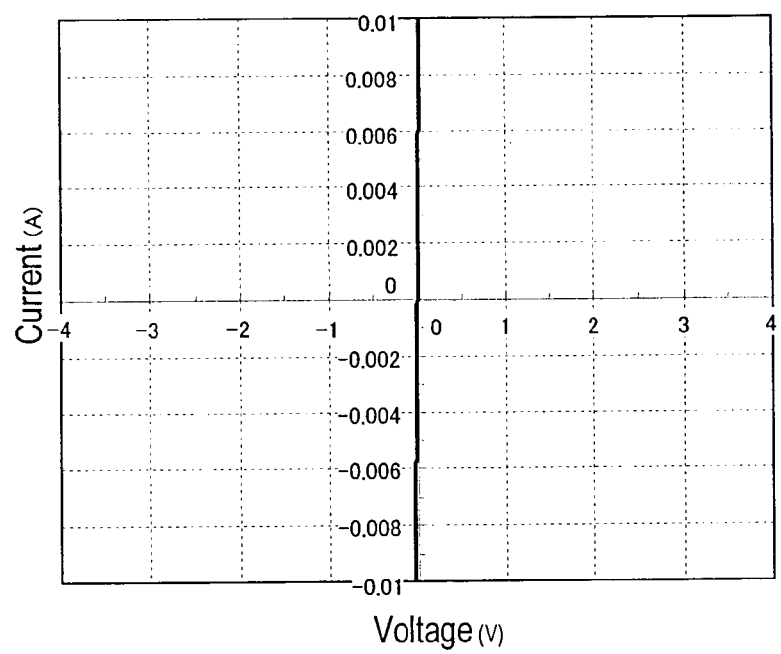

FIG. 3(a) is a graph showing current-voltage characteristics obtained from the Comparative Example, and FIG. 3(b) is a graph showing current-voltage characteristics obtained from the Example. As is clear from these graphs, a non-ohmic contact with a very high resistance value is created in the Comparative Example, whereas a very low contact resistance is realized in the Example. More specifically, the contact resistivity is reduced to $5\times10^{-4}\Omega\cdot cm^2$ or less. More preferably, by performing a sintering process in a nitrogen atmosphere, the contact resistance of the n-side electrode can be reduced. Specifically, by performing a sintering process at 400 to 500° C. for about 5 minutes, it was possible to reduce the contact resistance to about $5\times10^{-5}\Omega\cdot cm^2$.

Figure 4:
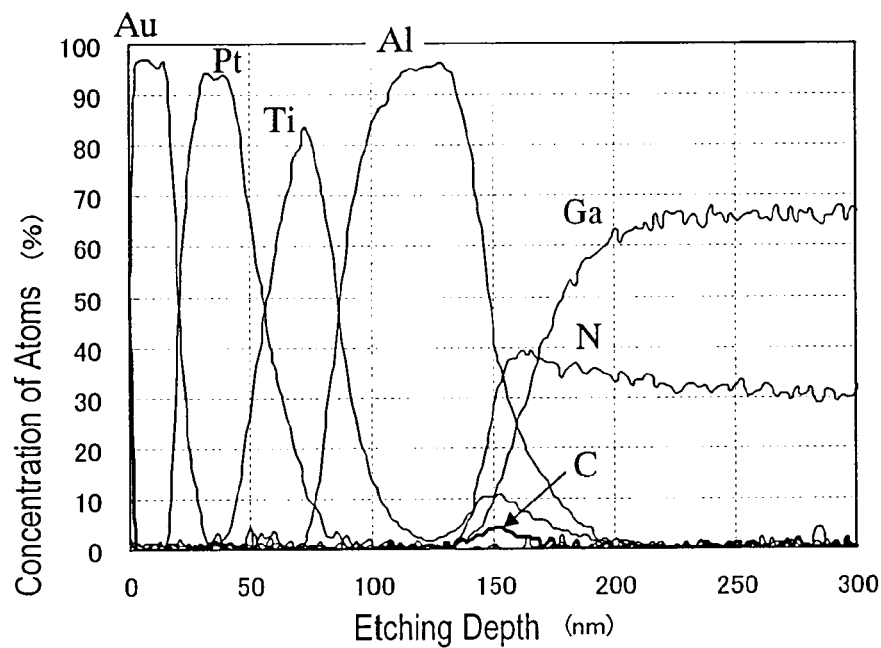
FIG. 4(a) is an element concentration profile obtained from the Comparative Example by Auger electron spectroscopy (AES) technique; and (b) is an element concentration profile by AES obtained from the Example.
Figure 4:
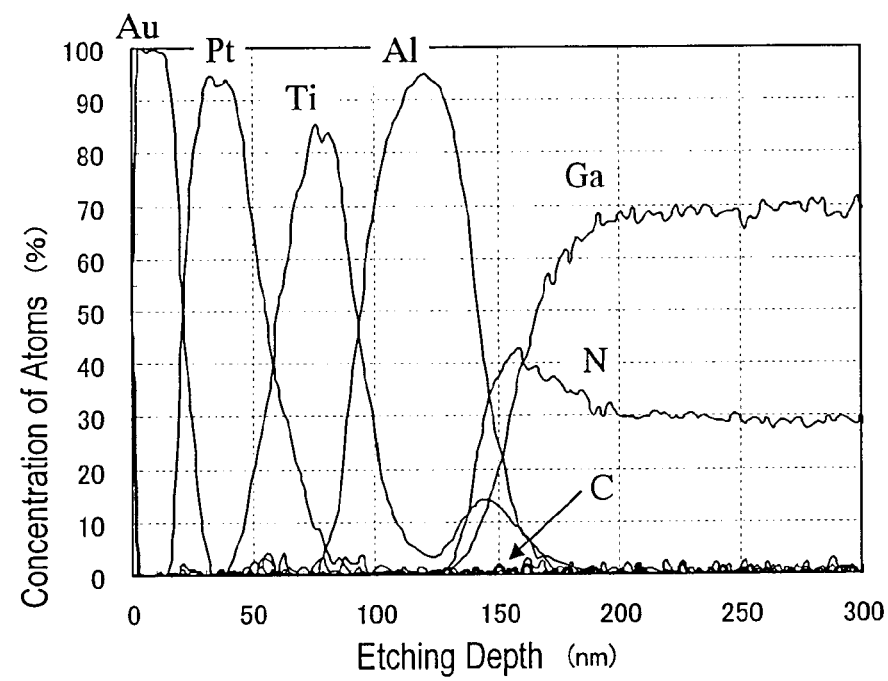

FIG. 4(a) is an element concentration profile obtained from the substrate rear face of the Comparative Example by Auger electron spectroscopy (AES) technique, and FIG. 4(b) is an element concentration profile by AES obtained from the Example.

In the graphs of FIGS. 4(a) and (b), Al, Pt, Ti, Au represent concentration profiles of elements detected from the metal layers composing the electrode, whereas Ga and N represent concentration profiles of elements detected from the GaN substrate. The etching depth on the horizontal axis corresponds to depth from the electrode surface into the GaN substrate.

As can be seen from FIG. 4(a), C (carbon) is clearly present near the interface between the electrode and the substrate rear face in the Comparative Example, with a peak concentration exceeding 5 atom %. On the other hand, no C (carbon) is detected at the interface of the electrode and the substrate rear face in the Example, as is clear from FIG. 4(b), with a peak concentration which is equal to or less than the measurable limit of an AES analyzer. In order to obtain the effects of reduction and stabilization of contact resistance, it is preferable to adjust the carbon concentration at the interface to 5 atom % or less, and more preferably 2 atom % or less.

Thus, it has been found that depositing and etching an $SiO_2$ film on the rear face of the GaN substrate makes it possible to remove carbon from the rear face of the GaN substrate and allow the contact resistance of a subsequently-formed electrode to be greatly reduced.

Although the effect of carbon removal may also be obtained when depositing and removing an insulative film other than an $SiO_2$ film, an $SiO_2$ film is particularly excellent from the standpoint of compatibility with the already-existing fabrication process. Moreover, since there is a possibility that the existence of oxygen atoms is playing an important role in the removal of carbon, it is preferable that the insulative film to be deposited contains oxygen (e.g., an oxide such as alumina ($Al_2O_3$), zirconia ($ZrO_2$), tantalum oxide ($Ta_2O_5$), or niobium oxide ($Nb_2O_5$)).

The method of depositing an insulative film such as an $SiO_2$ film is not limited to ECR sputtering technique, but any other thin film deposition method, such as plasma CVD technique, may also be adopted. In the case of using plasma CVD technique, there is a possibility that oxygen in the plasma is contributing to the removal of carbon.

Note that the effect of carbon removal was not obtained in the case where only a cleaning with hydrofluoric acid was performed, without depositing an $SiO_2$ film on the substrate rear face.

Embodiment 1

Hereinafter, with reference to the figures, a first embodiment of a nitride semiconductor device and a production method thereof according to the present invention will be described.

Figure 5:
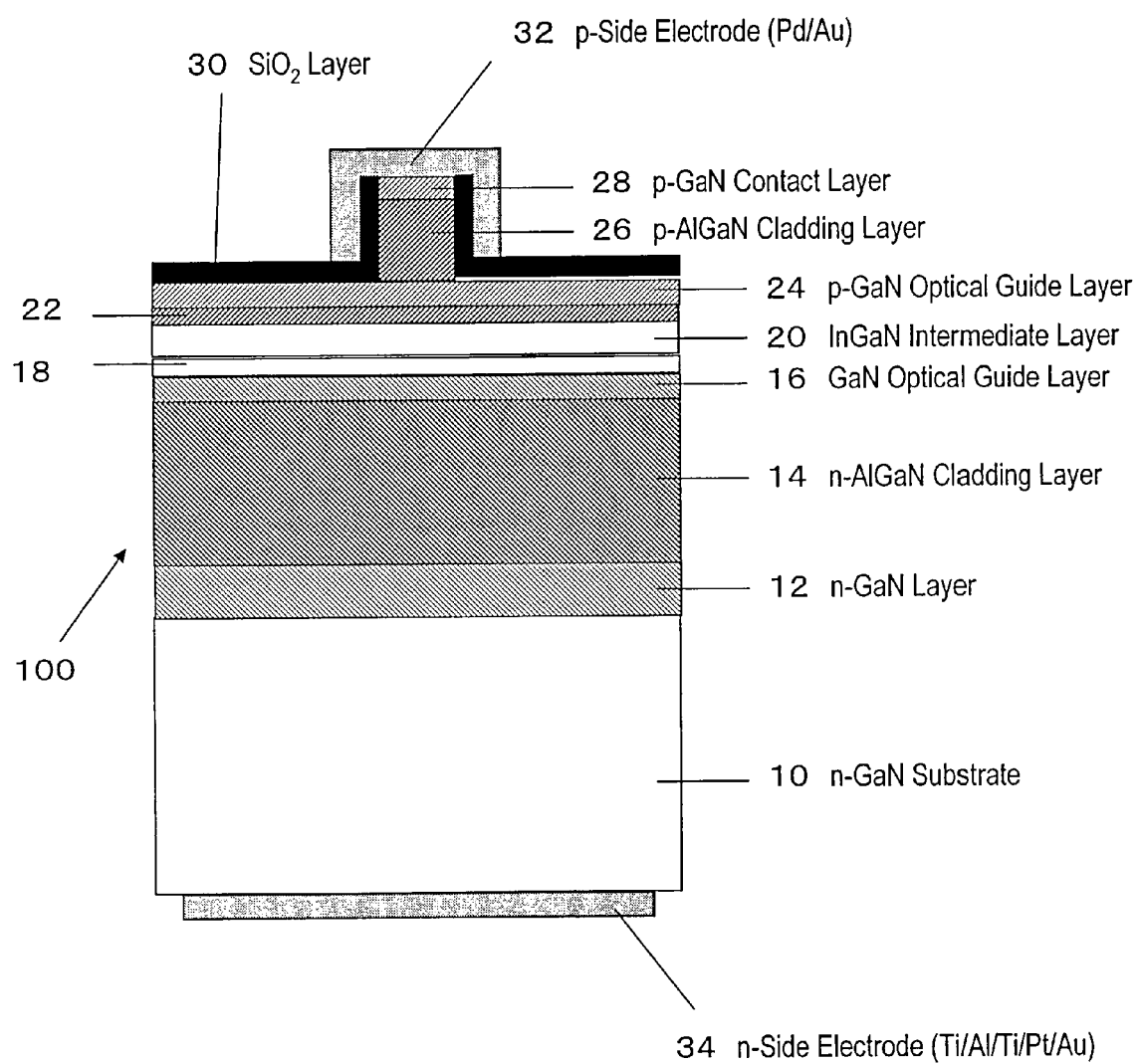
FIG. 5 A cross-sectional view showing a first embodiment of a nitride semiconductor device according to the present invention.

First, FIG. 5 is referred to. FIG. 5 schematically shows a cross section of a nitride semiconductor device of the present embodiment, i.e., a GaN-type semiconductor laser. The device cross section shown is a surface which is parallel to a resonator end face, with the resonator length direction lying orthogonal to this cross section.

The semiconductor laser of the present embodiment includes an n-GaN substrate (thickness: about 100 μm) 10 which is doped with an n-type impurity, and a semiconductor multilayer structure 100 which is formed on the front face (Ga surface) of the n-GaN substrate 10.

The semiconductor multilayer structure 100 includes an n-GaN layer 12, an n-AlGaN cladding layer 14, a GaN optical guide layer 16, an InGaN multi-quantum well layer 18, an InGaN intermediate layer 20, a p-AlGaN capping layer 22, a p-GaN optical guide layer 24, a p-AlGaN cladding layer 26, and a p-GaN contact layer 28.

The impurity concentration (dopant concentration) and thickness of each semiconductor layer included in the semiconductor multilayer structure 100 of the present embodiment are as shown in Table 1 below.

TABLE 1

| semiconductor layer | impurity concentration ($cm^{-3}$) | thickness |
|---|---|---|
| n-GaN layer 12 | Si: $5 \times 10^{17}$ | 1 μm |
| n-AlGaN cladding layer 14 | Si: $5 \times 10^{17}$ | 1.5 μm |
| GaN optical guide layer 16 | | 120 nm |
| InGaN multi-quantum well layer 18 | | active layer (3 nm)/ barrier layer (9 nm) |
| InGaN intermediate layer 20 | | 80 nm |
| p-AlGaN capping layer 22 | Mg: $1 \times 10^{19}$ | 20 nm |
| p-GaN optical guide layer 24 | Mg: $1 \times 10^{19}$ | 20 nm |
| p-AlGaN cladding layer 26 | Mg: $1 \times 10^{19}$ | 0.5 μm |
| p-GaN contact layer 28 | Mg: $1 \times 10^{20}$ | 0.1 μm |

Note that the impurities, impurity concentrations, and thicknesses of the semiconductor layers shown in Table 1 are only exemplary, and do not limit the present invention.

In the semiconductor multilayer structure 100, the p-GaN contact layer 28 and the p-AlGaN cladding layer 26 are processed in the shape of ridge stripes extending along the resonator length direction. The width of the ridge stripes is about 1.5 μm, for example, and the resonator length is 600 μm, for example. The chip width (the device size along a direction which is parallel to each semiconductor layer in FIG. 5) is 200 μm, for example.

Portions of the upper face of the semiconductor multilayer structure 100 excluding the upper face of the ridge stripe are coated with an $SiO_2$ layer 30, and a stripe aperture is formed in the central portion of the $SiO_2$ layer 30, through which the upper face of the ridge stripe is exposed. Via the aperture of the $SiO_2$ layer 30, the surface of the p-GaN contact layer 28 is in contact with a p-side electrode (Pd/Au) 32.

On the rear face of the n-GaN substrate 10, an n-side electrode (Ti/Al/Ti/Pt/Au) 34 is provided. In the present embodiment, the carbon concentration at the interface between the rear face of the n-GaN substrate 10 and the n-side electrode 34 is reduced to 5 atom % or less, and more specifically 2 atom % or less.

Hereinafter, a preferable embodiment of a method for producing the nitride semiconductor device according to the present embodiment will be described.

First, an n-GaN substrate 10 which has been produced by a known method is provided. The n-GaN substrate 10 has a thickness of about 400 μm, for example. The front face of the n-GaN substrate 10 has been planarized through a polishing process.

Next, a semiconductor multilayer structure 100 is formed on the front face of the n-GaN substrate 10. Formation of the semiconductor multilayer structure 100 can be performed by a known epitaxial growth technique. For example, the semiconductor layers are grown as follows.

First, the n-GaN substrate 10 is inserted into the chamber of a metal-organic vapor phase epitaxy (MOVPE) apparatus.

Thereafter, a heat treatment (thermal cleaning) at about 500 to 1100° C. is performed for the front face of the n-GaN substrate 10. For example, this heat treatment is performed at 750° C. for 1 minute or more, and desirably for 5 minutes or more. While performing this heat treatment, it is preferable to allow a gas containing nitrogen atoms (N) (e.g., $N_2$, $NH_3$, or hydrazine) to flow within the chamber.

Thereafter, the temperature of the reactor is controlled to about 1000° C., and trimethylgallium (TMG) and ammonia ($NH_3$) gases (as the source gas) and hydrogen and nitrogen (as the carrier gas) are simultaneously supplied, and also a silane ($SiH_4$) gas is supplied as an n-type dopant, thus growing an n-GaN layer 12 having a thickness of about 1 μm and an Si impurity concentration of about $5 \times 10^{17} cm^{-3}$.

Next, while also supplying trimethylaluminum (TMA), an n-AlGaN cladding layer 14 of $Al_{0.05}Ga_{0.95}N$, having a thickness of about 1.5 μm and an Si impurity concentration of about $5 \times 10^{17} cm^{-3}$, is grown. Then, after growing a GaN optical guide layer 16 of GaN having a thickness of about 120 nm, the temperature is lowered to about 800° C.; the carrier gas is changed from hydrogen to nitrogen; and trimethylindium (TMI) and TMG are supplied, thus growing a multi-quantum well active layer 18 which includes quantum wells (3 layers) of $In_{0.1}Ga_{0.9}N$ having a film thickness of about 3 nm and $In_{0.02}Ga_{0.98}N$ barrier layers (2 layers) having a film thickness of about 9 nm. Thereafter, an InGaN intermediate layer 20 of $In_{0.01}Ga_{0.99}N$ is grown. The InGaN intermediate layer 20 significantly suppresses p-type dopant (Mg) diffusion from the overlying p-type semiconductor layer to the active layer 18, so that the active layer 18 can be maintained at a high quality even after crystal growth.

Next, the temperature in the reactor is again increased to about 1000° C., hydrogen is also introduced as the carrier gas, and while supplying a biscyclopentadienyl magnesium ($Cp_2Mg$) gas which is a p-type dopant, and an p-AlGaN capping layer 22 of $Al_{0.15}Ga_{0.85}N$ having a film thickness of about 20 nm and an Mg impurity concentration of about $1 \times 10^{19} cm^{-3}$ is grown.

Next, a second GaN optical guide layer 24 of p-GaN having a thickness of about 20 nm and an Mg impurity concentration of about $1 \times 10^{19} cm^{-3}$ is grown. Thereafter, an p-AlGaN cladding layer 26 of $Al_{0.05}Ga_{0.95}N$ having a thickness of about 0.5 μm and an impurity concentration of about $1 \times 10^{19} cm^{-3}$ is grown. Finally, a p-GaN contact layer 28 having a thickness about 0.1 μm and an Mg impurity concentration of about $1 \times 10^{20} cm^{-3}$ is grown.

Next, the n-GaN substrate 10 is polished from the rear face side, and the thickness of the n-GaN substrate 10 is reduced to about 100 μm. Thereafter, in the present embodiment, an $SiO_2$ film having a thickness 0.5 to 1.5 μm is deposited on the rear face (polished surface) of the n-GaN substrate 10 by ECR sputtering technique.

Thereafter, the $SiO_2$ film is etched to remove the $SiO_2$ film from the rear face of the n-GaN substrate 10. On the rear face of the n-GaN substrate 10, the $SiO_2$ film needs to be completely removed at least from the region in which an n-side electrode is to be formed. In the present embodiment, removal of the $SiO_2$ film is performed with hydrofluoric acid. The etchant used for removing the $SiO_2$ film is not limited to hydrofluoric acid, but other kinds of etchants may also be used. Moreover, the removal of the $SiO_2$ film is not limited to wet etching, but dry etching, or a combination of wet etching and dry etching may also be used.

Thereafter, on the rear face of the n-GaN substrate 10, metal layers of Ti/Al/Ti/Pt/Au are successively deposited in this order from the substrate side, thus forming an n-side electrode 34. Next, a sintering process (about 400° C.) is performed in a nitrogen atmosphere, whereby the semiconductor laser as shown in FIG. 5 is obtained. This sintering process has the effect of further reducing the contact resistance of the n-side electrode 34.

As a Comparative Example against the present embodiment, a semiconductor laser was produced by a method in which the treatment of depositing and removing an $SiO_2$ film on the rear face of the n-GaN substrate 10 is omitted. The semiconductor laser of the present embodiment and the semiconductor laser of the Comparative Example were evaluated as follows, with respect to their current-optical output characteristics and current-voltage characteristics.

Figure 6:
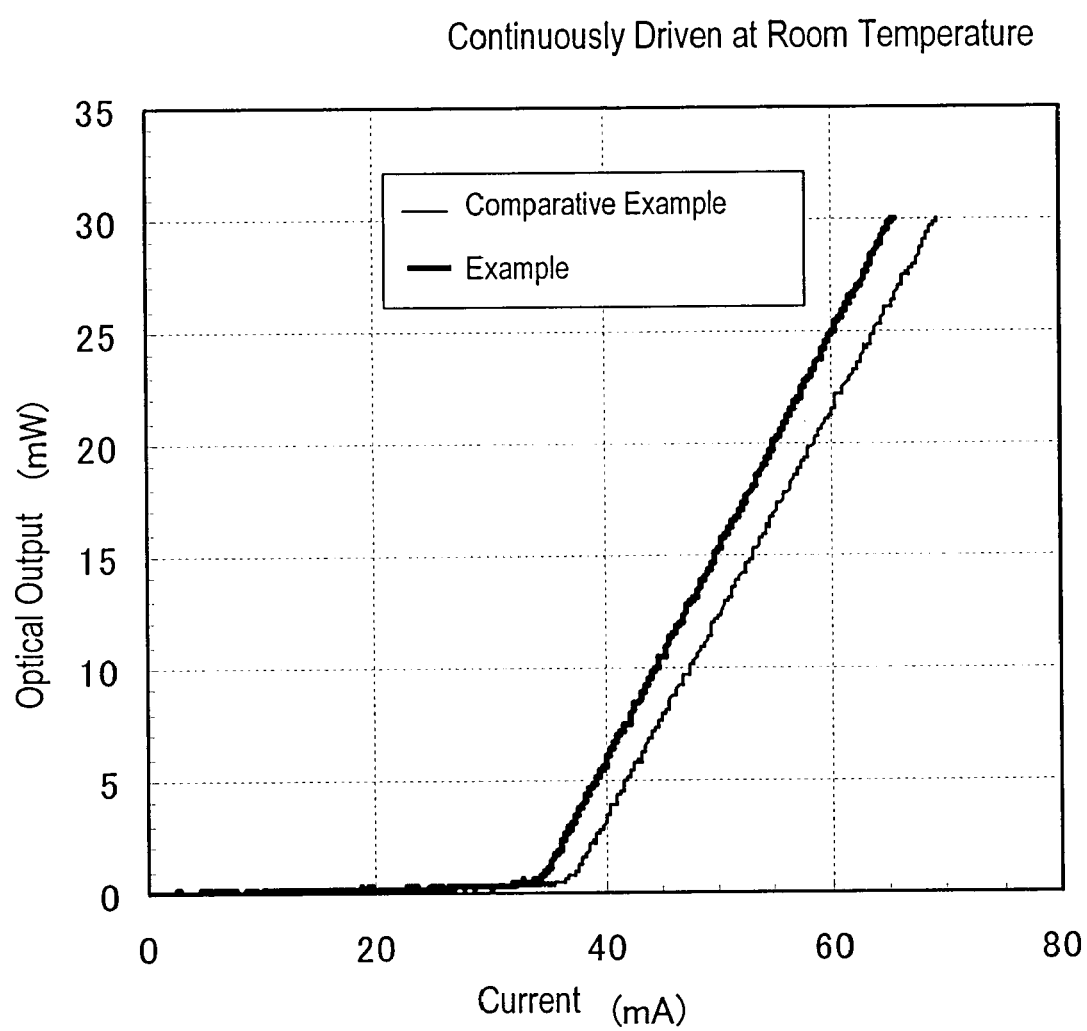
FIG. 6 A graph showing current-optical output characteristics obtained from the semiconductor laser of Embodiment 1 and the Comparative Example.

FIG. 6 is a graph showing current-optical output characteristics as measured at room temperature. The horizontal axis of the graph shows the size of a current (driving current) flowing between the p-side electrode and the n-side electrode, whereas the vertical axis shows the laser optical output which is obtained from laser oscillation. As can be seen from FIG. 6, in the embodiment in which deposition and removal of an $SiO_2$ film was performed on the substrate rear face, the threshold value of laser oscillation is lowered and a high optical output is obtained with a relatively low driving current, as compared to the Comparative Example.

Figure 7:
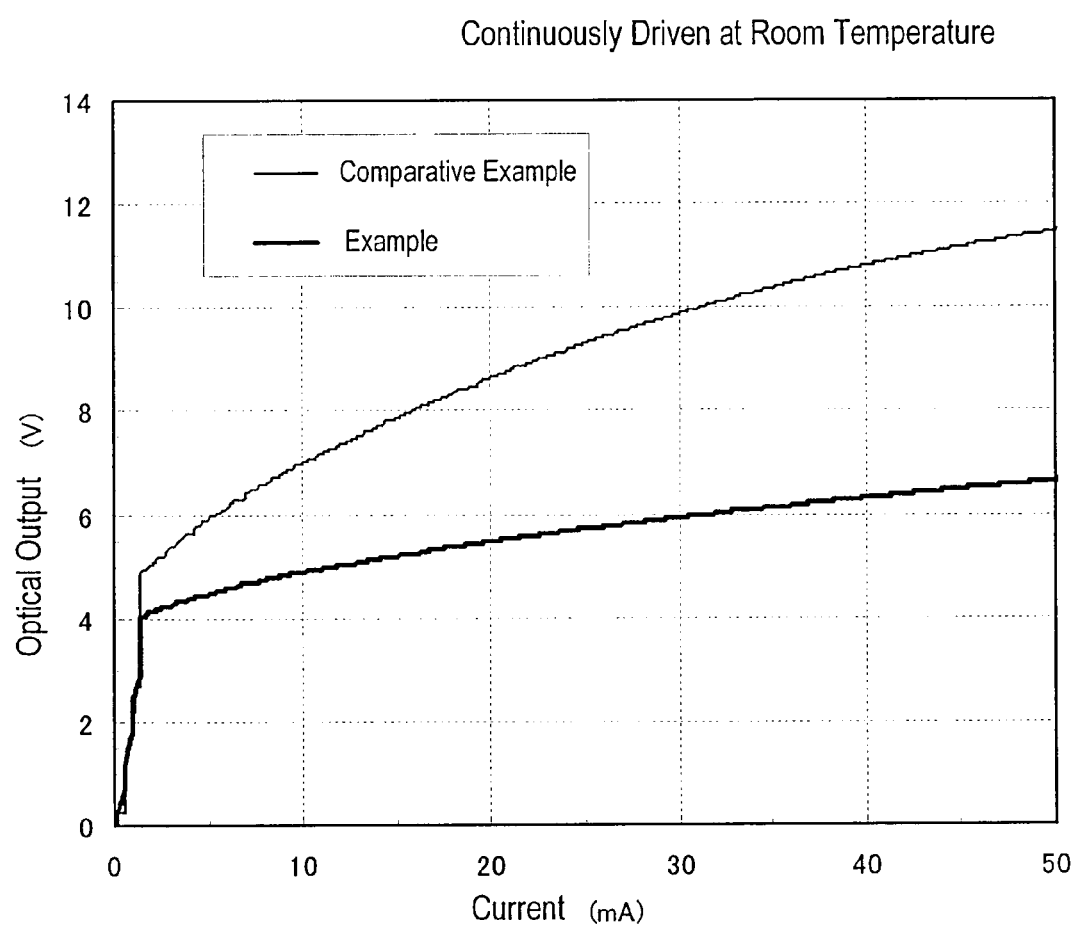
FIG. 7 A graph showing current-voltage characteristics obtained from the semiconductor laser of Embodiment 1 and the Comparative Example.

FIG. 7 is a graph showing current-voltage characteristics as measured at room temperature. The horizontal axis of the graph shows the size of a current (driving current) flowing between the p-side electrode and the n-side electrode, whereas the vertical axis shows the voltage applied between the electrodes. As can be seen from FIG. 7, in the embodiment in which deposition and removal of an $SiO_2$ film was performed on the substrate rear face, the same level of driving current is obtained with a lower voltage than in the Comparative Example.

Embodiment 2

In the above-described embodiment, the substrate rear face is composed of a flat N surface. However, the present invention is not limited to such cases. Hereinafter, with reference to FIG. 8 to FIG. 10, various variants of the substrate rear face of the nitride semiconductor device according to the present invention will be described.

Figure 8:
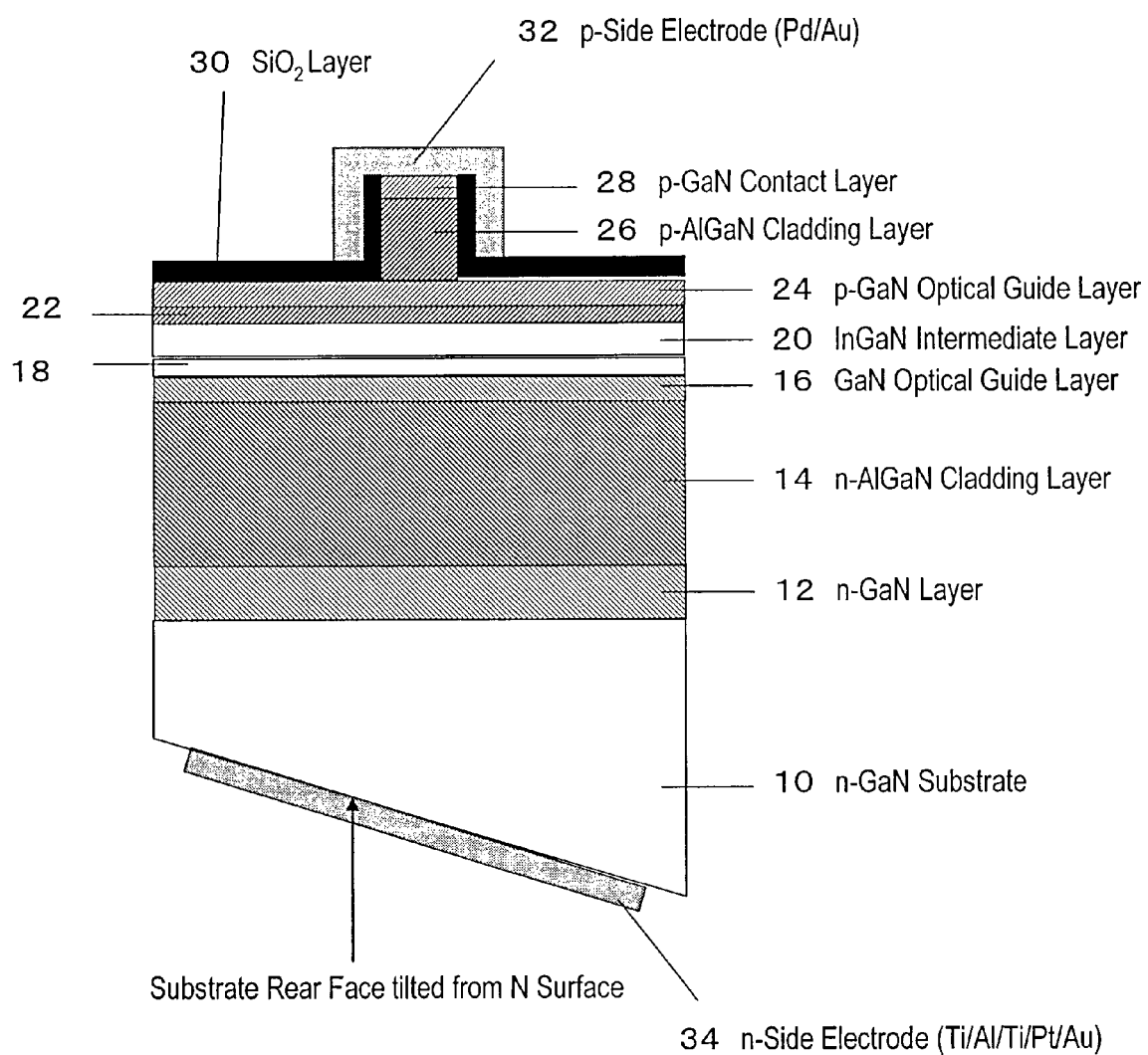
FIG. 8 Describes a variant of the substrate rear face of a nitride semiconductor device according to the present invention.

First, as shown in FIG. 8, the entire substrate rear face may be tilted from the N surface. This can be realized by, when polishing the substrate rear face, fixing the substrate rear face so as to be tilted with respect to a grinder. As described earlier, carbon may likely be adsorbed to an N surface. Therefore, the present invention provides an outstanding effect in the case of forming the n-side electrode 34 on an N surface. In the case where the substrate rear face is tilted from the N surface as shown in FIG. 8, the carbon concentration at the interface between the n-side electrode 34 and the substrate rear face might possibly be kept relatively low, without even performing the rear face treatment step of the present invention. However, in the case where the tilt angle is small or a multitude of small steps of the N surface are formed on the slope, it is expected that removal of carbon will provide an excellent effect.

Figure 9:
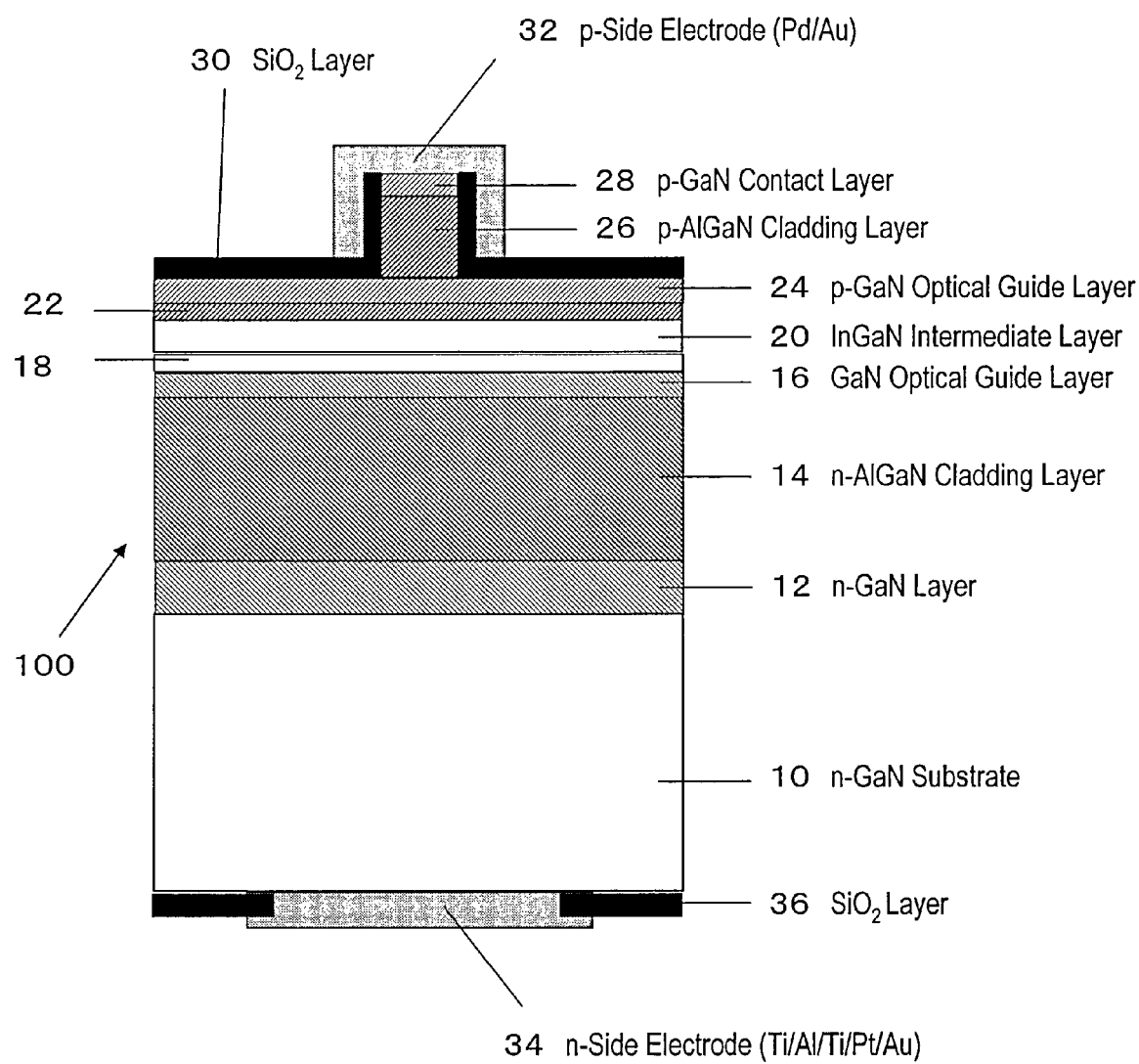
FIG. 9 Describes a further variant of the substrate rear face of a nitride semiconductor device according to the present invention.

Next, as shown in FIG. 9, an insulating layer 36 such as an $SiO_2$ film may remain in a portion of the substrate rear face. Although it is necessary to remove the insulative film from the region where the n-side electrode 34 needs to be in contact with the substrate rear face, the contact characteristics will not be affected even if a portion of the insulative film remains around the n-side electrode 34 as the insulating layer 36. Moreover, when the insulating layer 34 composed of $SiO_2$ or the like is allowed to remain on the substrate rear face, the insulating layer 34 will absorb the light (stray light) leaking from the active layer 18 to the substrate 10, thus providing a noise reducing effect.

Figure 10:
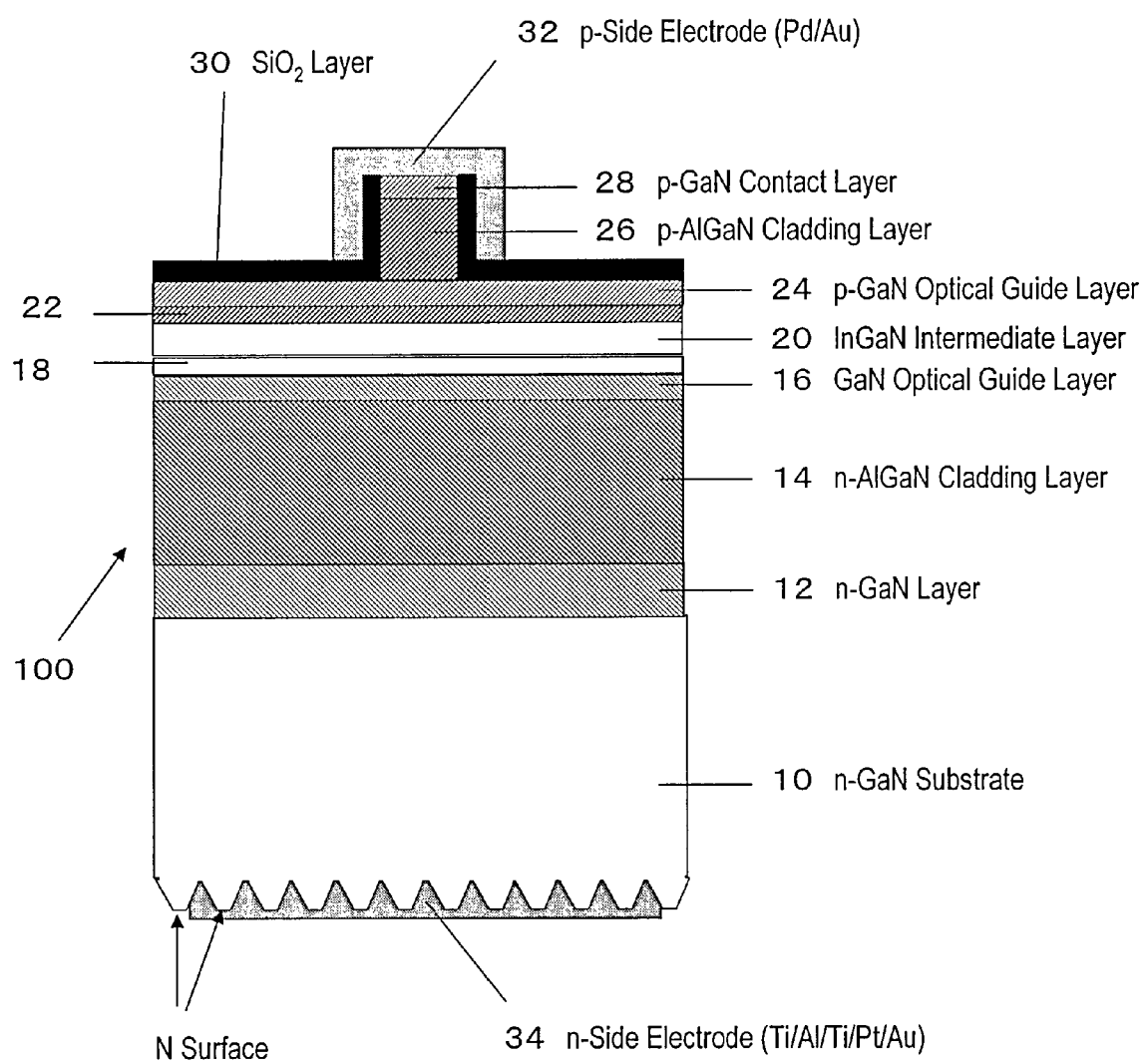
FIG. 10 Describes a further variant of the substrate rear face of a nitride semiconductor device according to the present invention.

Furthermore, as shown in FIG. 10, bumps and dents may be formed on the substrate rear face. This can be realized by subjecting the substrate rear face to wet etching with potassium hydroxide (KOH), hot phosphoric acid, or the like and/or dry etching. When bumps and dents are formed on the substrate rear face, too, if the N surface is partially exposed, carbon will adsorb to that N surface and deteriorate the contact characteristics. The need to perform the rear face treatment (carbon-reducing treatment) according to the present invention will decrease when bumps and dents are formed on the substrate rear face so as to increase the area ratio of a surface to which carbon is unlikely to adsorb. However, when the N surface partially exists as described above, the significance of employing the present invention emerges. The present invention can exhibit an outstanding effect in the case where the N surface accounts for an area ratio of 10% in the region where the substrate rear face comes in contact with the n-side electrode. An even higher effect will be obtained when this area ratio increases to 30% or more.

Note that forming bumps and dents on the substrate rear face will result in an increased contact area, and thus contribute to reduction of contact resistance. Depending on the shapes of the bumps and dents formed on the substrate rear face, a crystal plane to which carbon is more likely to adsorb than to the Ga surface might possibly be formed even when no N surface is exposed. In such cases, the contact characteristics can be improved according to the present invention.

Note that, as a result of reducing the carbon concentration at the interface between the substrate rear face and the electrode, the present invention makes it possible to employ various kinds of metals which have conventionally not been used as the material of the n-side electrode. In other words, as the material of the n-side electrode, it becomes possible to employ a metal or alloy such as Ti, Al, Pt, Au, Mo, Sn, In, Ni, Cr, Nb, Ba, Ag, Rh, Ir, Ru, or Hf.

Although the above-described embodiments employ a GaN substrate as the nitride semiconductor substrate, the nitride semiconductor substrate may be a substrate composed of AlGaN, InGaN, or the like, without being limited to GaN. Alternatively, the substrate may be an OFF substrate.

INDUSTRIAL APPLICABILITY

The present invention improves the n-side electrode contact characteristics of nitride semiconductor devices, which are expected to be utilized as short-wavelength light sources or devices having a high breakdown voltage, and therefore is able to contribute to mass production of highly-reliable nitride semiconductor lasers and the like.

The invention claimed is:

1. A nitride semiconductor device comprising: a nitride-type semiconductor substrate having a shorter side surface and a longer side surface, and containing an n-type impurity; a semiconductor multilayer structure formed on a principal face of the semiconductor substrate, the semiconductor multilayer structure including a p-type region and an n-type region; a p-side electrode which is in contact with a portion of the p-type region included in the semiconductor multilayer structure; and an n-side electrode provided on a rear face of the semiconductor substrate, wherein the rear face of the semiconductor substrate slopes at an angle from the shorter side surface to the longer side surface, with a carbon concentration of 5 atom % or less at an interface between the rear face of the semiconductor substrate and the n-side electrode.

2. The nitride semiconductor device of claim 1, wherein the n-side electrode includes a layer composed of at least one kind of metal or alloy selected from the group consisting of Ti, Al, Pt, Au, Mo, Sn, In, Ni, Cr, Nb, Ba, Ag, Rh, Ir, Ru, and Hf.

3. The nitride semiconductor device of claim 1, wherein the n-side electrode has a contact resistivity of $5 \times 10^{-4} \Omega \cdot cm^2$ or less.

4. The nitride semiconductor device of claim 1, wherein the nitrogen surface accounts for an area ratio of 10% or more in the rear face of the semiconductor substrate.

5. The nitride semiconductor device of claim 1, wherein the carbon concentration at the interface is 2 atom % or less.

6. The nitride semiconductor device of claim 1, wherein the rear face of the semiconductor substrate is composed of a polished surface.

7. The nitride semiconductor device of claim 1, wherein an insulating layer containing oxygen is provided on a portion of the rear face of the semiconductor substrate.

8. A production method for a nitride semiconductor device, comprising: a step of providing a nitride-type semiconductor substrate having a shorter side surface and a longer side surface, and containing an n-type impurity; a step of forming a semiconductor multilayer structure on a principal face of the semiconductor substrate, the semiconductor multilayer structure including a p-type region and an n-type region; a step of forming a p-side electrode on the p-type region included in the semiconductor multilayer structure; and a step of forming an n-side electrode on a rear face of the semiconductor substrate, the rear face being sloped at an angle from the shorter side surface to the longer side surface, wherein, before forming the n-side electrode on the rear face of the semiconductor substrate, a step of reducing a carbon concentration in the rear face is performed.

9. The production method for a nitride semiconductor device of claim 8, wherein the step of reducing the carbon concentration comprises:
   a step of forming an insulative film on the rear face of the semiconductor substrate; and
   a step of removing the insulative film.

10. The production method for a nitride semiconductor device of claim 8, wherein the step of reducing the carbon concentration comprises:
    a step of depositing a silicon oxide film on the rear face of the semiconductor substrate; and
    a step of removing the silicon oxide film.

11. The production method for a nitride semiconductor device of claim 8, wherein the step of reducing the carbon concentration comprises a step of exposing the rear face of the semiconductor substrate to a plasma.

12. A production method for a nitride semiconductor device, comprising: a step of depositing an insulative film on a rear face of a nitride-type semiconductor substrate, wherein the semiconductor substrate has a shorter side surface and a longer side surface, and the rear face slopes at an angle from the shorter side surface to the longer side surface; a step of removing the insulative film; and a step of forming an electrode on the rear face of the semiconductor substrate.

13. The production method for a nitride semiconductor device of claim 12, wherein the insulative film is composed of silicon oxide.

* * * * *